(12) United States Patent
Takahashi

(10) Patent No.: US 6,570,280 B2
(45) Date of Patent: May 27, 2003

(54) SOLDER-BONDING STRUCTURE AND BRUSHLESS MOTOR HAVING THE SAME

(75) Inventor: Hideyuki Takahashi, Toyohashi (JP)

(73) Assignee: Asmo Co., Ltd., Shizuoka (JP)

( * ) Notice: Subject to any disclaimer, the term of this patent is extended or adjusted under 35 U.S.C. 154(b) by 0 days.

(21) Appl. No.: 09/920,863

(22) Filed: Aug. 3, 2001

(65) Prior Publication Data

US 2002/0047504 A1 Apr. 25, 2002

(30) Foreign Application Priority Data

Aug. 11, 2000 (JP) .......................................... 2000-244762

(51) Int. Cl.7 ................................................. H05K 3/34
(52) U.S. Cl. ........................................... 310/71; 439/83
(58) Field of Search ............................. 439/83; 310/71, 310/DIG. 6

(56) References Cited

U.S. PATENT DOCUMENTS

| | | | |
|---|---|---|---|
| 2,902,629 A | * | 9/1959 | Little et al. ................. 174/260 |
| 3,784,955 A | * | 1/1974 | Reynolds et al. ............. 439/79 |
| 4,541,034 A | * | 9/1985 | Fanning ....................... 174/255 |
| 4,575,167 A | * | 3/1986 | Minter ........................ 439/637 |

FOREIGN PATENT DOCUMENTS

| | | | |
|---|---|---|---|
| JP | Y2-57-18782 | 4/1982 | ............ H05K/1/18 |
| JP | U-59-185873 | 12/1984 | ............ H05K/3/34 |
| JP | A-59-218793 | 12/1984 | ............ H05K/1/18 |
| JP | U-61-83079 | 6/1986 | ............ H05K/3/36 |
| JP | U-61-87466 | 6/1986 | ............ H05K/1/18 |

* cited by examiner

Primary Examiner—Burton S. Mullins
(74) Attorney, Agent, or Firm—Posz & Bethards, PLC

(57) ABSTRACT

A bonding portion of a connector terminal includes embossed portions and a slit. Each embossed portion is formed by embossing the bonding portion in a thicknesswise direction of the bonding portion to provide an embossed recess on one of opposed sides of the bonding portion. Each embossed recess communicates opposed open ends of an elongated hole provided in a circuit board with each other when the bonding portion is inserted to a predetermined position in the elongated hole. The slit penetrates through the bonding portion. The slit extends over at least one of the opposed open ends of the elongated hole in the thicknesswise direction of the circuit board when the bonding portion is inserted to the predetermined position in the elongated hole.

9 Claims, 10 Drawing Sheets

FIG. 2A
FIG. 2B
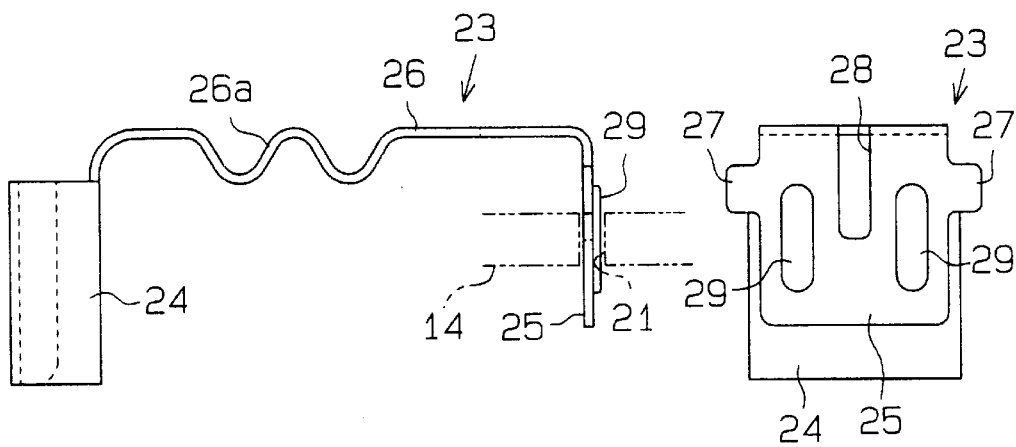
FIG. 3
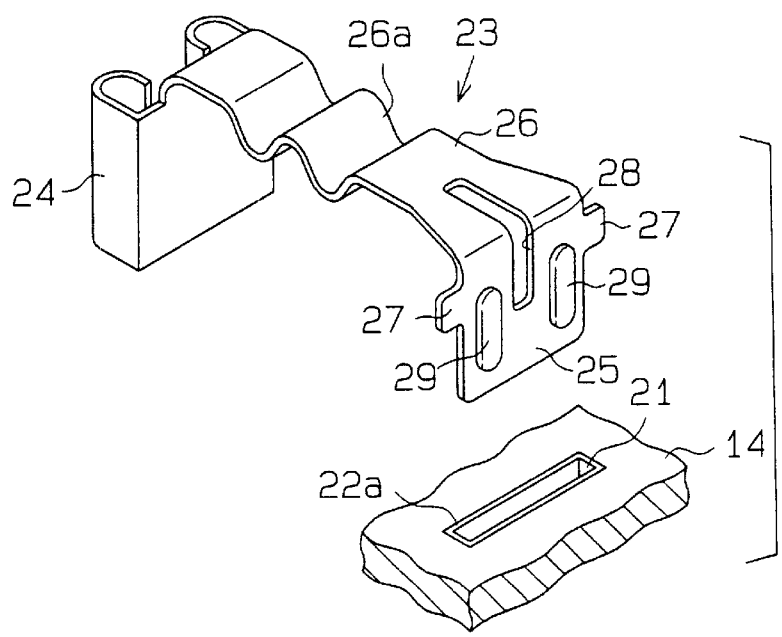

FIG. 14A
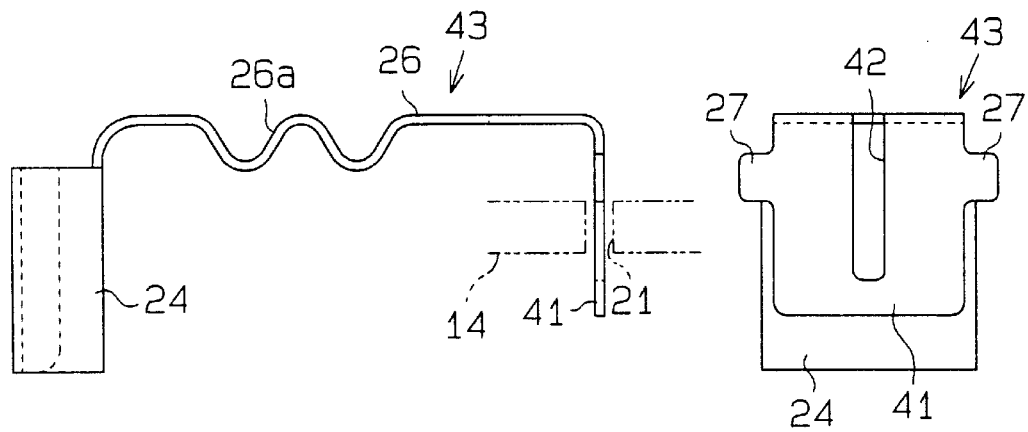
FIG. 14B
FIG. 15
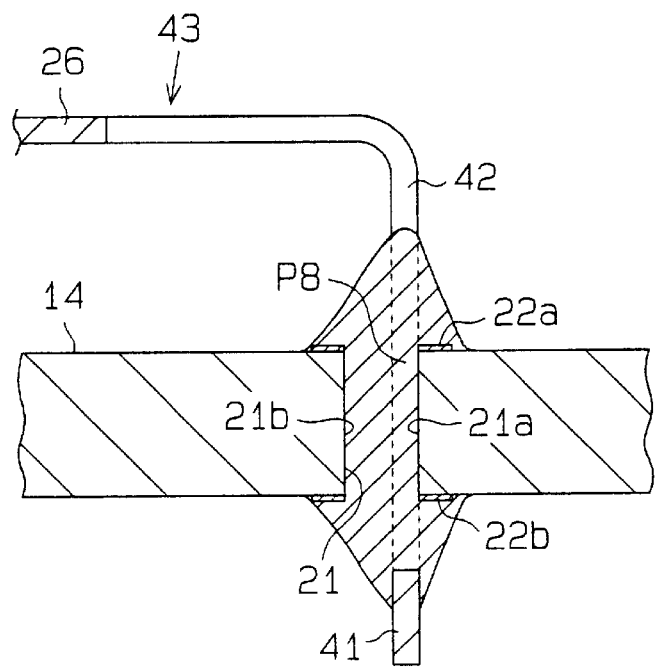

FIG. 16  RELATED ART
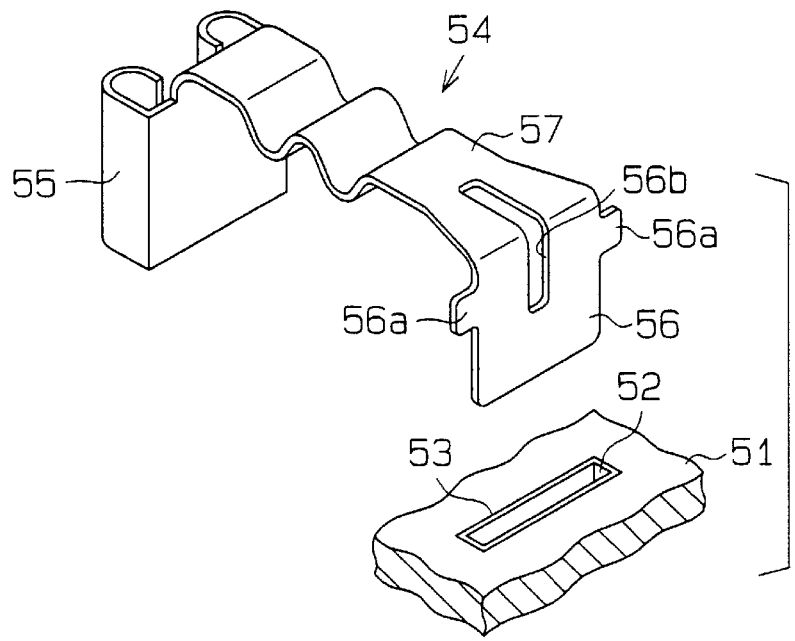
FIG. 17A
RELATED ART
FIG. 17B
RELATED ART
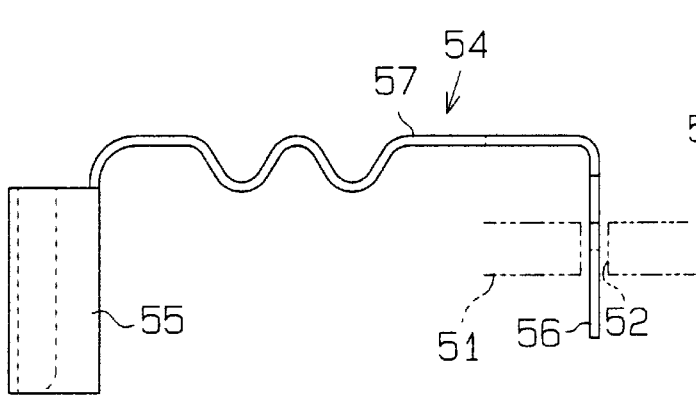
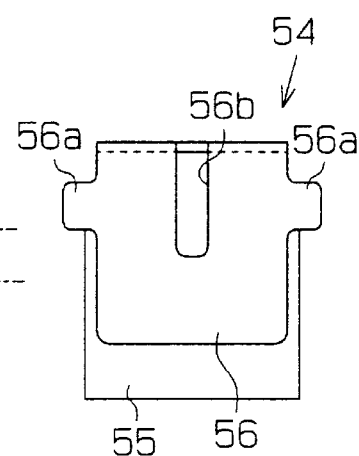

SOLDER-BONDING STRUCTURE AND BRUSHLESS MOTOR HAVING THE SAME

CROSS REFERENCE TO RELATED APPLICATION

This application is based on and incorporates herein by reference Japanese Patent Application No. 2000-244762 filed on Aug. 11, 2000.

BACKGROUND OF THE INVENTION

1. Field of the Invention

The present invention relates to a solder-bonding structure of a terminal and also to a brushless motor including the terminal having one end connected to exciting coils and the other end solder-bonded to a circuit board through the solder-bonding structure.

2. Description of Related Art

One type of brushless motor used, for example, as a blower motor of a vehicle air conditioning system includes a stator and a circuit board. The stator includes exciting coils, and the circuit board includes an excitation circuit. A power supply terminal for supplying electric power to the exciting coils is electrically connected to the excitation circuit of the circuit board through a connector terminal. One previously proposed structure for connecting the connector terminal to the excitation circuit of the circuit board is shown in FIGS. 16 to 19.

As shown in FIG. 16, an elongated hole 52 penetrates through the circuit board 51, and conductors 53 are provided around opposed open ends of the elongated hole 52, respectively (FIGS. 18 and 19). As shown in FIGS. 16–17B, the connector terminal 54 includes a fitting portion 55, a bonding portion 56 and a bridge 57. The fitting portion 55 is fitted to or electrically connected to the power supply terminal (not shown) that is, in turn, connected to the exciting coils. The bonding portion 56 is received within the elongated hole 52 and is solder-bonded to the conductors 53. The bridge 57 electrically connects between the fitting portion 55 and the bonding portion 56. With the above arrangement, the exciting coils are electrically connected to the excitation circuit through the connector terminal 54 and the conductors 53.

With reference to FIG. 17A, the elongated hole 52 is formed to receive the plate-shaped bonding portion 56 therein. As shown in FIGS. 16 and 17B, a couple of positioning projections 56a are provided on opposed ends of the bonding portion 56, respectively. The positioning projections 56a abut against the circuit board 51 and determine a position of the bonding portion 56 in an insertion direction of the bonding portion 56. At the center of the bonding portion 56, a slit 56b is provided as a through hole that penetrates through a portion of the bonding portion 56 and a portion of the bridge 57. More specifically, when the bonding portion 56 is inserted to a predetermined position in the elongated hole 52, the slit 56b extends from the bridge 57 to about one half the depth of the elongated hole 52 of the circuit board 14.

As shown in FIG. 18, after the bonding portion 56 is inserted through the elongated hole 52, the bonding portion 56 is solder-bonded to the conductors 53. This solder-bonding is conducted as follows. That is, a solder material (not shown) is applied to one flat surface 56c (located on the left side in FIG. 18) of a base end side region (where the slit 56b is formed) of the bonding portion 56. Then, a soldering iron (not shown) is applied against the other flat surface 56d (located on the right side in FIG. 18) of the bonding portion 56 to melt the solder material. During this solder-bonding process, melted solder material flows through a flow passage 58 formed by the slit 56b toward an opposite side of the bonding portion 56 in a direction perpendicular to the bonding portion 56. Furthermore, the melted solder material also flows toward an opposite side of the circuit board 51 (toward the distal end side of the bonding portion 56) through spaces 59a, 59b formed between the bonding portion 56 and wall surfaces of the elongated hole 52 when the bonding portion 56 is inserted through the elongated hole 52 and is positioned in the center of the cross-section of the elongated hole 52. In this way, the bonding portion 56 is solder-bonded to the conductors 53.

However, it may happen that the bonding portion 56 is not positioned in the center of the elongated hole 52 due to, for example, size variation or positioning error of the connector terminal 54 and/or the circuit board 51 (FIG. 19). If the solder-bonding is conducted while the flat surface 56d is engaged with wall surface 52a extending in a horizontal direction of the cross-section of the elongated hole 52, the melted solder material is restrained from flowing toward the distal end side of the flat surface 56d of the bonding portion 56. Thus, as shown in FIG. 19, the solder material is accumulated on the distal end side of the flat surface 56c of the bonding portion 56, so that the distal end side of the flat surface 56d of the bonding portion 56 is not solder-bonded to the conductor 53. As a result, bonding strength of the solder-bonded portion is weakened. Especially, in the case of the brushless motor or the like, the connector terminal 54 is connected to the stator, so that the solder-bonded portion can be easily damaged (easily cracked) by vibrations of the stator. In order to avoid this, the distal end side of the bonding portion 56 can be first solder-bonded to the conductor 53 prior to solder-bonding the rest of the bonding portion 56. However, this will disadvantageously lengthen the solder-bonding operation.

SUMMARY OF THE INVENTION

The present invention addresses the above disadvantages. Thus, it is an objective of the present invention to provide a solder-bonding structure of a terminal that allows easy and proper solder-bonding thereof. It is another objective of the present invention to provided a brushless motor having such a solder-bonding structure of the terminal.

To achieve the objectives of the present invention, there is provided a solder-bonding structure including a circuit board and a plate-shaped terminal. The circuit board has an elongated hole penetrating through the circuit board. The elongated hole is provided with two conductors arranged around opposed open ends of the elongated hole, respectively. The plate-shaped terminal is arranged to be received through the elongated hole of the circuit board and to be solder-bonded to the conductors. The terminal includes at least one flow-passage defining portion that defines at least one flow passage. The at least one flow passage allows flow of melted solder material therethrough in a direction that is generally parallel to a plane of the circuit board and also in a direction that is generally perpendicular to a plane of the circuit board. Alternatively or additionally, the at least one flow passage may allow flow of melted solder material from one of opposed sides of the terminal to the other of opposed sides of the terminal within the elongated hole and may also allows flow of the melted solder material along each one of opposed wall surfaces of the elongated hole from one of the open ends of the elongated hole to the other of the open ends of the elongated hole even when one of the opposed sides of the terminal abuts against one of the opposed wall surfaces of the elongated hole.

There is also provided a brushless motor that includes a stator and a solder-bonding structure. The stator has a plurality of exciting coils. The solder-bonding structure includes a circuit board and a plate-shaped terminal. The circuit board has an excitation circuit for supplying electric current to the plurality of exciting coils. The circuit board has an elongated hole that penetrates through the circuit board. The elongated hole is provided with two conductors arranged around opposed open ends of the elongated hole, respectively. The plate-shaped terminal is electrically connected to the plurality of exciting coils. The terminal is arranged to be received through the elongated hole of the circuit board and to be solder-bonded to the conductors. The terminal includes at least one flow-passage defining portion that defines at least one flow passage. The at least one flow passage allows flow of melted solder material therethrough in a direction that is generally parallel to a plane of the circuit board and also in a direction that is generally perpendicular to a plane of the circuit board.

BRIEF DESCRIPTION OF THE DRAWINGS

The invention, together with additional objectives, features and advantages thereof, will be best understood from the following description, the appended claims and the accompanying drawings in which:

FIG. 2A is a side view of a connector terminal according to the embodiment;

FIG. 2B is a front view of the connector terminal shown in FIG. 2A;

FIG. 3 is a perspective view showing a circuit board and the connector terminal according to the embodiment;

FIG. 14A is a side view showing another modification of FIG. 2A;

FIG. 14B is a front view of the connector terminal shown in FIG. 14A;

FIG. 15 is a schematic cross-sectional view showing a bonding portion of the connector terminal of FIGS. 14A and 14B solder-bonded to the conductors of the circuit board;

FIG. 16 is a perspective view showing a previously proposed circuit board and a previously proposed connector terminal;

FIG. 17A is a side view of the previously proposed connector terminal shown in FIG. 16;

FIG. 17B is a front view of the previously proposed connector terminal shown in FIG. 17A;

DETAILED DESCRIPTION OF THE INVENTION

One embodiment of the present invention will be described with reference to FIGS. 1 to 11.

Figure 1:
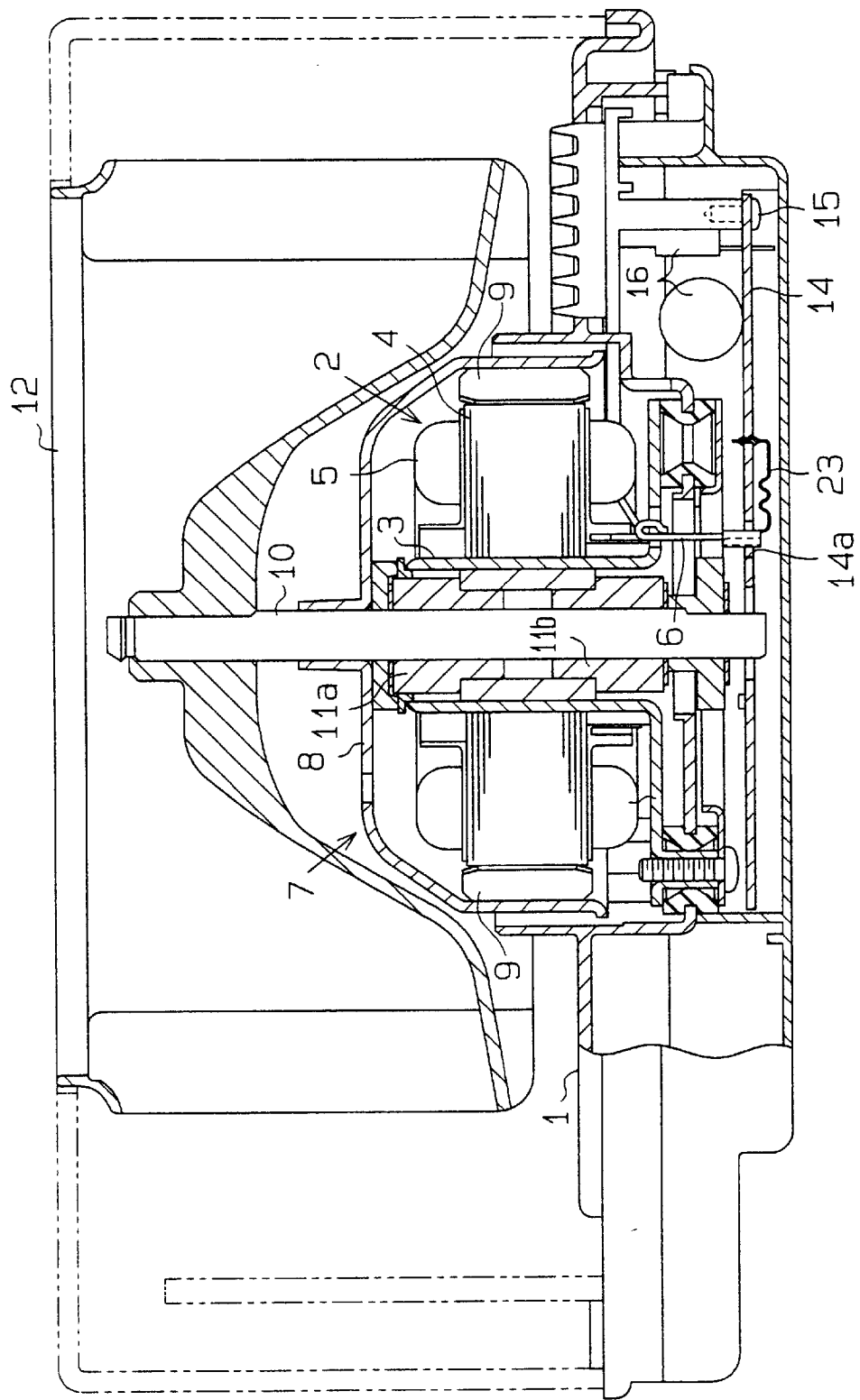
FIG. 1 is a cross-sectional view of a brushless motor according to the present embodiment.

FIG. 1 shows a brushless motor used as a blower motor of a vehicle air conditioning system. A stator 2 is secured to a top surface of a motor holder 1. The stator 2 includes a center piece 3, a core 4 and exciting coils 5 wound around the core 4. A base end of a power supply terminal 6 is press fitted within the center of the core 4, and a distal end of the power supply terminal 6 extends downwardly. Ends of the exciting coils 5 are electrically connected to the power supply terminal 6 with use of crimp contacts.

A rotor 7 is rotatably supported by the stator 2. The rotor 7 includes a bell-shaped yoke 8, a plurality of magnets 9 and an output shaft 10. The magnets 9 are secured to an inner peripheral surface of the yoke 8. The output shaft 10 is press fitted through the center of the yoke 8. The output shaft 10 is rotatably supported in the center of the center piece 3 via bearings 11a, 11b. A fan 12 is secured to a top end of the output shaft 10.

A circuit board 14 is secured to a bottom surface of the motor holder 1 with screws 15. The circuit board 14 has an excitation circuit 16 that generates a rotating magnetic field in the stator 2. A through hole 14a penetrates through the circuit board 14, and the power supply terminal 6 extends through the through hole 14a. Furthermore, as shown in FIG. 3, an elongated through hole 21 penetrates through the circuit board 14. Two conductors 22a, 22b (FIG. 5) are provided around opposed open ends of the elongated hole 21, respectively. The power supply terminal 6 is electrically connected to the conductors 22a, 22b through a connector terminal 23.

As shown in FIGS. 2A to 3, the connector terminal 23 includes a fitting portion 24, a bonding portion 25 and a bridge 26. The fitting portion 24 is fitted to or electrically connected to the power supply terminal 6. The bonding portion 25 acts as a terminal that is inserted within the elongated hole 21 and then is solder-bonded to the conductors 22a, 22b. The bridge 26 electrically connects between the fitting portion 24 and the bonding portion 25. As shown in FIG. 2A, the elongated hole 21 is formed to receive the plate-like bonding portion 25 therein.

With reference to FIGS. 2A and 3, the bridge 26 includes a vibration attenuating section 26a having a wavy shape.

With reference to FIGS. 2B and 3, a couple of positioning projections 27 are provided on opposed ends of the bonding portion 25, respectively. The positioning projections 27 abut against the circuit board 14 and determine a position of the bonding portion 25 in an insertion direction of the bonding portion 25.

At the center of the bonding portion 25, a slit 28 is provided as a through hole that penetrates through a portion of the bonding portion 25 and also a portion of the bridge 26. More specifically, as shown in FIG. 6, when the bonding portion 25 is inserted to a predetermined position in the elongated hole 21, the slit 28 extends from the bridge 26 to about one half the depth of the elongated hole 21.

The bonding portion 25 has embossed portions 29 that protrude on a side opposite to the fitting portion 24 in a direction that is generally perpendicular to a plane of the bonding portion 25. In the present embodiment, two embossed portions 29 are arranged next to each other or are spaced from each other in a horizontal direction of the bonding portion 25 on the left and right sides of the slit 28, respectively. When the bonding portion 25 is inserted to the predetermined position in the elongated hole 21 an embossed recess 29a (FIGS. 5 and 9) of each embossed portion 29 extends outwardly beyond each one of the opposed sides of the circuit board 14 in a direction generally perpendicular to the plane of the circuit board 14 (vertical direction) to communicate the opposed open ends of the elongated hole 21. The amount of protrusion of each embossed portion 29 in the perpendicular direction of the bonding portion 25 is selected such that the bonding portion 25 is spaced away from at least one of opposed wall surfaces 21a, 21b of the elongated hole 21, which extend in a direction that is generally parallel to a plane of the circuit board (first direction), when the bonding portion 25 is inserted to the predetermined position in the elongated hole 21. In the present embodiment, the slit 28 and the embossed portions 29 act as flow-passage defining portions.

Figure 7:
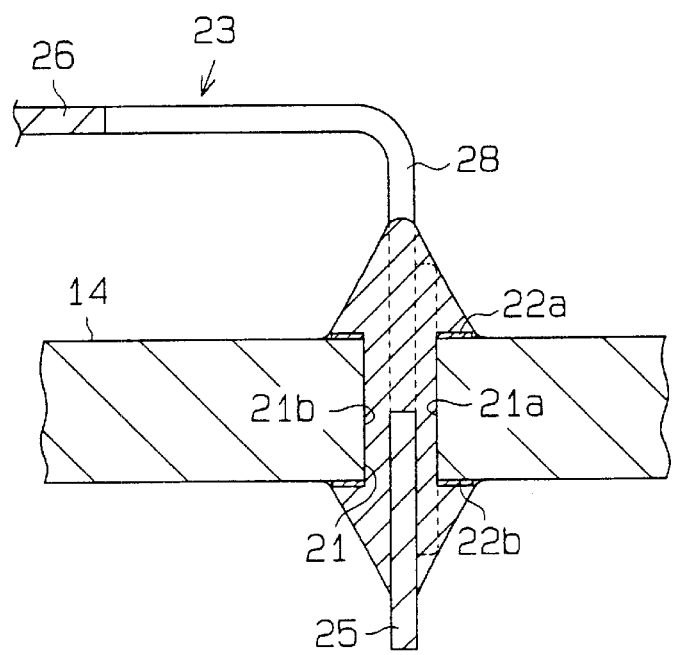
FIG. 7 is a schematic cross-sectional view showing a bonding portion of the connector terminal solder-bonded to conductors of the circuit board.

As shown in FIG. 7, after the bonding portion 25 is inserted to the predetermined position in the elongated hole 21, the bonding portion 25 is solder-bonded to the conductors 22a, 22b of the circuit board 14. The solder-bonding of the present embodiment is conducted as follows. That is, on the embossed recess 29a side (left side in FIG. 5) of the bonding portion 25, a solder material (not shown) is applied to a flat surface 25a of the bonding portion 25 located on a base end side (side where the slit 28 is formed and where the conductor 22a is located). Then, a soldering iron is applied against a top surface of an embossed protrusion 29b of each bonding portion 25 at the base end side of the bonding portion 25 to melt the solder material.

Figure 4:
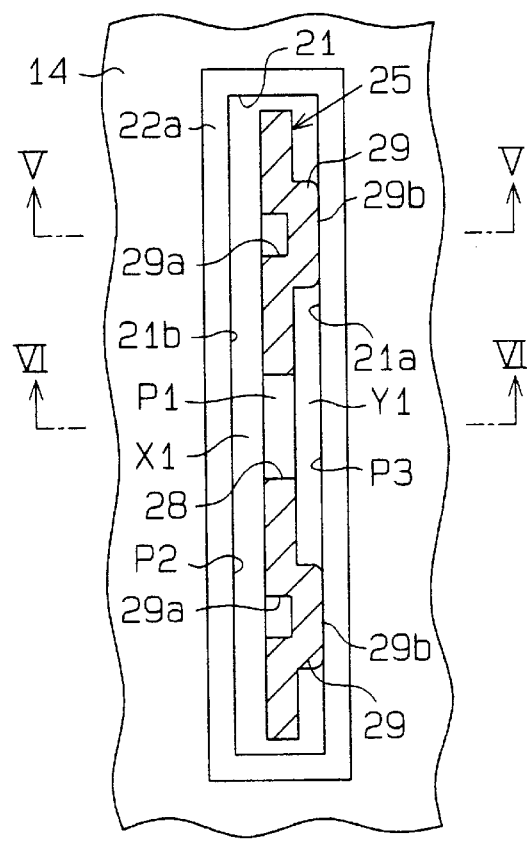
FIG. 4 is a schematic view showing the connector terminal received through an elongated hole of the circuit board.
Figure 5:
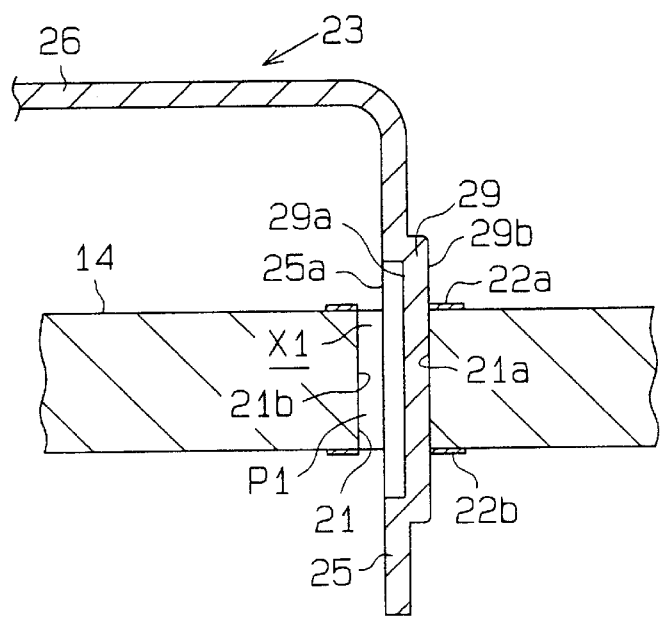
FIG. 5 is a cross-sectional view along line V—V in FIG. 4.
Figure 6:
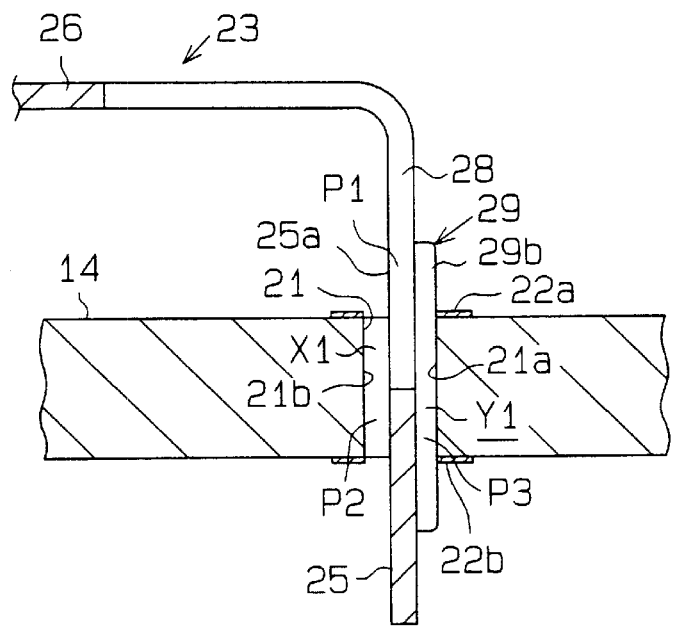
FIG. 6 is a cross-sectional view along line VI—VI in FIG. 4.

As shown in FIGS. 4 to 6, during the solder-bonding process, it may happen that the top surface of each embossed protrusion 29b (located on the right side of the bonding portion 25 in FIGS. 4 to 6) engages the wall surface 21a of the elongated hole 21. At this engaged state, there are formed first to third flow passages P1–P3 that allow flow of the melted solder material toward an opposite side of the bonding portion 25 in a direction that is generally perpendicular to the bonding portion 25 (second direction), toward an opposite side of the circuit board 14 (toward the conductor 22b side) in a direction that generally intersects or more preferably is perpendicular to the circuit board 14 (third direction) and also toward the opposite side of the circuit board 14 in the third direction on the opposite side of the bonding portion 25, respectively.

More specifically, the slit 28 provides the first flow passage P1 (FIG. 6) that allows the melted solder material to flow toward the opposite side of the bonding portion 25 in the second direction perpendicular to a plane of the bonding portion 25. On the embossed recess 29a side of the bonding portion 25, a space X1 is provided because of the engagement between the top surface of each embossed protrusion 29b (located on the right side of the bonding portion 25 in FIGS. 4 to 6) and the wall surface 21a of the elongated hole 21. The space X1 provides the second flow passage P2 that allows the melted solder material to flow toward the opposite side of the circuit board 14. Furthermore, on the embossed protrusion 29b side of the bonding portion 25, a space Y1 is provided on a base end side of each embossed protrusion 29b because of the engagement between the top surface of each embossed protrusion 29b and the wall surface 21a of the elongated hole 21. The space Y1 provides the third flow passage P3 that allows the melted solder material to flow toward the opposite side of the circuit board 14.

Thus, during the soldering process, the melted solder material flows toward the opposite side of the bonding portion 25 in the second direction (on the embossed protrusion 29b side of the bonding portion 25 and also on the conductor 22a side of the circuit board 14) through the first flow passage P1. Also, the melted solder material flows toward the opposite side of the circuit board 14 (on the conductor 22b side of the circuit board 14 and also on the embossed recess 29a side of the bonding portion 25) through the second flow passage P2. Furthermore, the melted solder material flows toward the opposite side of the circuit board 14 (on the conductor 22b side of the circuit board 14 and also on the embossed protrusion 29b side of the bonding portion 25) through the third flow passage P3. During the soldering process, a portion of the melted solder material flows toward the opposite side of the bonding portion 25 in the second direction through spaces located outside of ends of the bonding portion 25, respectively.

As a result, effective flow of the melted solder material is achieved, so that the bonding portion 25 of the connector terminal 23 can be properly solder-bonded to both the conductors 22a, 22b of the circuit board 14, as shown in FIG. 7.

Figure 8:
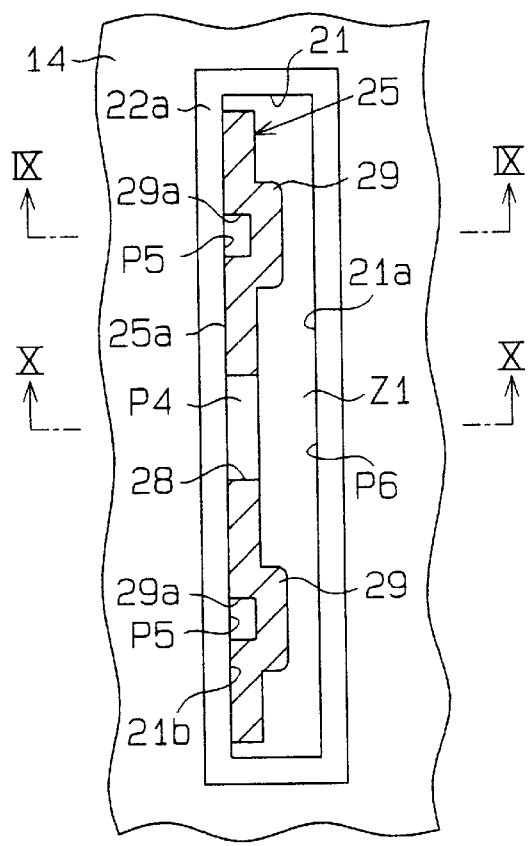
FIG. 8 is a schematic view showing the connector terminal received through the elongated hole of the circuit board.
Figure 9:
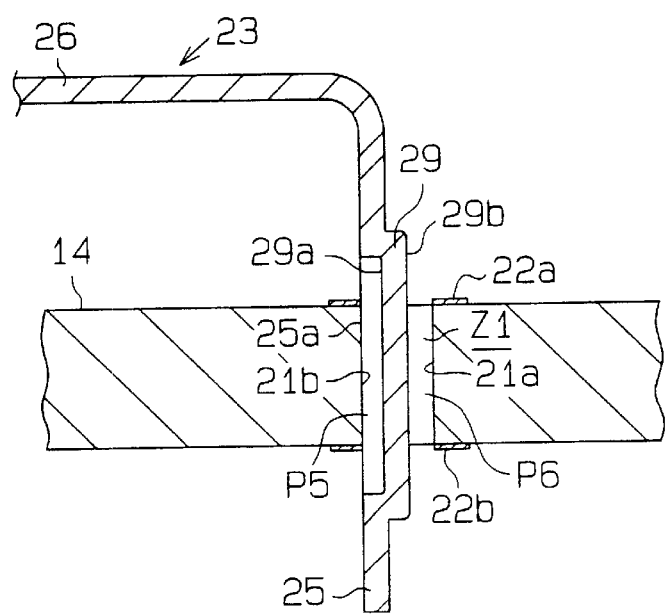
FIG. 9 is a cross-sectional view along line IX—IX in FIG. 8.
Figure 10:
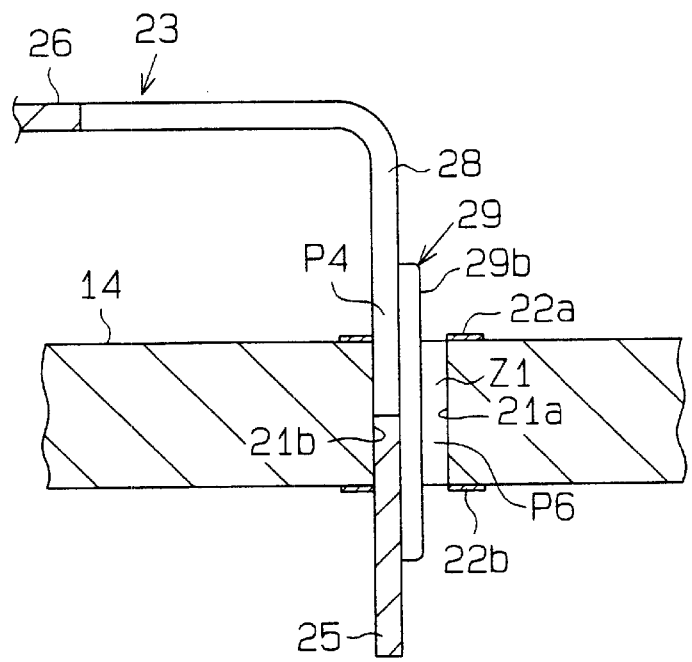
FIG. 10 is a cross-sectional view along line X—X in FIG. 8.

Different from the above-described case, as shown in FIGS. 8–10, during the solder-bonding process (more specifically, during the insertion of the bonding portion 25), it may happen that the flat surface 25a of the bonding portion 25 located on the embossed recess 29a side of the bonding portion 25 (left side of the bonding portion 25 in FIGS. 8 to 10) engages the wall surface 21b of the elongates hole 21. At this engaged state, there are formed fourth to sixth flow passages P4–P6 that allow flew of the melted solder material toward the opposite side of the bonding portion 25 in the second direction, toward the opposite side of the circuit board 14 (toward the conductor 22b side) in the third direction and also toward the opposite side of the circuit board 14 in the third direction on the opposite side of the bonding portion 25, respectively.

More specifically, the slit 28 provides the fourth flow passage P4 (FIG. 10) that allows the melted solder material to flow toward the opposite side of the bonding portion 25 in the second direction. On the embossed recess 29a side of the bonding portion 25, as shown in FIG. 9, the embossed recess 29a of each embossed portion 29 communicates between the opposed sides of the circuit board 14 and thereby provides the flow passage P5 through which the melted solder material can flow toward the opposite side of the circuit board 14. Furthermore, on the embossed protrusion 29b side of the bonding portion 25, a space Z1 is provided on a base end side of each embossed protrusion 29b because of the engagement between the flat surface 25a of the protrusion 25 and the wall surface 21b of the elongated hole 21. The space Z1 provides the sixth flow passage P6 that allows the melted solder material to flow toward the opposite side of the circuit board 14.

Thus, during the soldering process, the melted solder material flows toward the opposite side of the bonding portion 25 in the second direction (on the embossed protrusion 29b side of the bonding portion 25 and also on the conductor 22a side of the circuit board 14) through the fourth flow passage P4. Also, the melted solder material flows toward the opposite side of the circuit board 14 (on the conductor 22b side of the circuit board 14 and also on the embossed recess 29a side of the bonding portion 25) through the fifth flow passage P5. Furthermore, the melted solder material flows toward the opposite side of the circuit board 14 (on the conductor 22b side of the circuit board 14 and also on the embossed protrusion 29b side of the bonding portion 25) through the sixth flow passage P6. During the soldering process, a portion of the melted solder material flows toward the opposite side of the bonding portion 25 in the second direction through spaces located outside of ends of the bonding portion 25, respectively.

Figure 11:
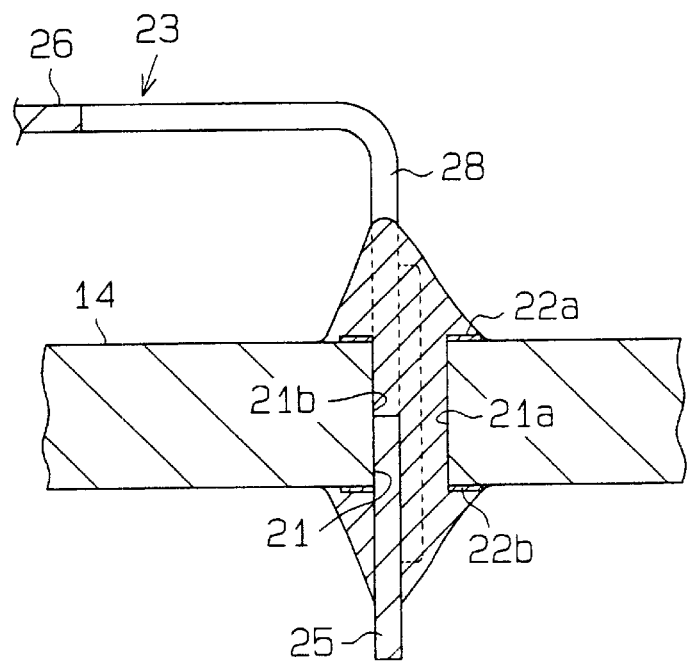
FIG. 11 is a schematic cross-sectional view showing the bonding portion of the connector terminal solder-bonded to the conductors of the circuit board.

As a result, effective flow of the melted solder material is achieved, so that the bonding portion 25 of the connector terminal 23 can be properly solder-bonded to both the conductors 22a, 22b of the circuit board 14, as shown in FIG. 11.

Characteristic advantages of the embodiment will be described.

(1) When the top surface of each embossed protrusion 29b (located on the right side of the bonding portion in FIGS. 4 to 6) engages the wall surface 21a of the elongated hole 21, the slit 28 and the embossed portions 29 provide the first to third flow passages P1–P3 that allow flow of the melted solder material toward the opposite side of the bonding portion 25 in the second direction, toward the opposite side of the circuit board 14 (toward the conductor 22b side) in the third direction and also toward the opposite side of the circuit board 14 in the third direction on the opposite side of the bonding portion 25, respectively. Furthermore, when the flat surface 25a of the bonding portion 25 located on the embossed recess 29a side (located on the left side of the bonding portion 25 in FIGS. 8 to 10) engages the wall surface 21b of the elongated hole 21, fourth to sixth flow passages P4–P6 are provided for allowing flow of the melted solder material toward the opposite side of the bonding portion 25 in the second direction, toward the opposite side of the circuit board 14 (toward the conductor 22b side) in the third direction and also toward the opposite side of the circuit board 14 in the third direction on the opposite side of the bonding portion 25, respectively. Thus, as shown in FIGS. 7 and 11, the effective flow of the melted solder material is achieved, so that the bonding portion 25 of the connector terminal 23 can be properly solder-bonded to both the conductors 22a, 22b of the circuit board 14. As a result, the soldered portion is not easily damaged (not easily cracked) even when vibrations of the stator 2 are transmitted to the connector terminal 23. Also, unlike the previously proposed solder bonding structure, it is not required to perform the soldering from the distal end of the bonding portion 25, which thereby leads to a reduction in a soldering operation time.

(2) The two embossed portions 29 are arranged next to each other in the first direction. Thus, when the top surface of each embossed protrusion 29b (located on the right side of the boding portion 25) engages the wall surface 21a of the elongated hole 21, it is ensured that the space Y1 is formed between the embossed protrusions 29b at the base end side thereof, which thereby ensures provision of the third flow passage P3.

(3) The two embossed portions 29 are arranged next to each other in the first direction. Thus, each flow passage P1–P6 can be formed around the center of the bonding portion 25. As a result, the melted solder material properly flows through each flow passage P1–P6.

(4) The opposed ends of the bonding portion 25 have positioning projections 27, respectively, that abut against the circuit board 14 in the insertion direction when the bonding portion 25 is inserted to the predetermined position in the elongated hole 21. Thus, the positioning of the bonding portion 25 in the insertion direction is eased. Furthermore, because the bonding portion 25 is appropriately positioned at the predetermined position in the elongated hole 21, provision of the fifth flow passage P5 is thereby ensured.

(5) The bridge 26 includes the vibration attenuating section 26a. Thus, even when the stator 2 vibrates during the operation of the brushless motor, the vibrations of the stator 2 are attenuated by the vibration attenuating section 26a, thereby restraining the vibrations of the bonding portion 25. As a result, the soldered portion of the bonding portion 25 is not easily damaged (not easily cracked).

The above embodiment can be modified as follows.

In the above embodiment, the slit 28 and the embossed portions 29 are formed as the flow-passage defining portions. However, the flow-passage defining portion can have any other forms as long as they can provide glow passages that allow the flow of the melted solder material toward the opposite side of the bonding portion 25 in the second direction, toward the opposite side of the circuit board 14 in the third direction and also toward the opposite side of the circuit board 14 in the third direction on the opposite side of the bonding portion 25, respectively, when one of the opposed sides of the bonding portion 25 engages one of the wall surfaces 21a, 21b.

Figure 12A:
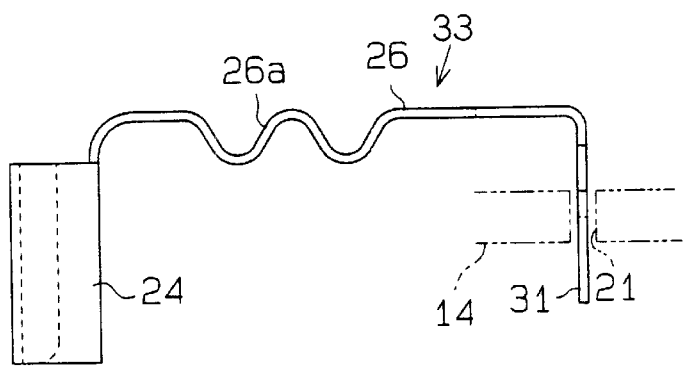
FIG. 12A is a side view showing a modification of FIG. 2A.
Figure 12B:
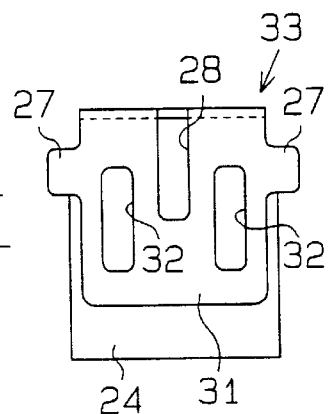
FIG. 12B is a front view of the connector terminal shown in FIG. 12A.
Figure 13:
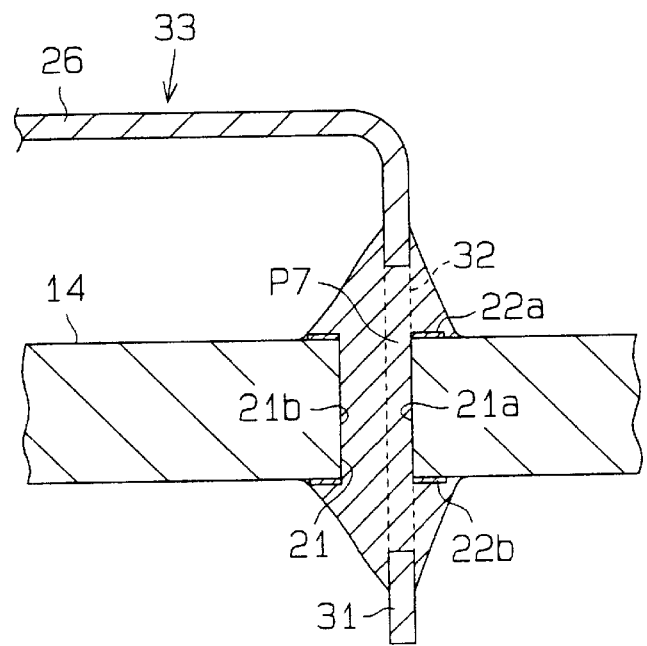
FIG. 13 is a schematic cross-sectional view showing a bonding portion of the connector terminal of FIGS. 12A and 12B solder-bonded to the conductors of the circuit board.
Figure 18:
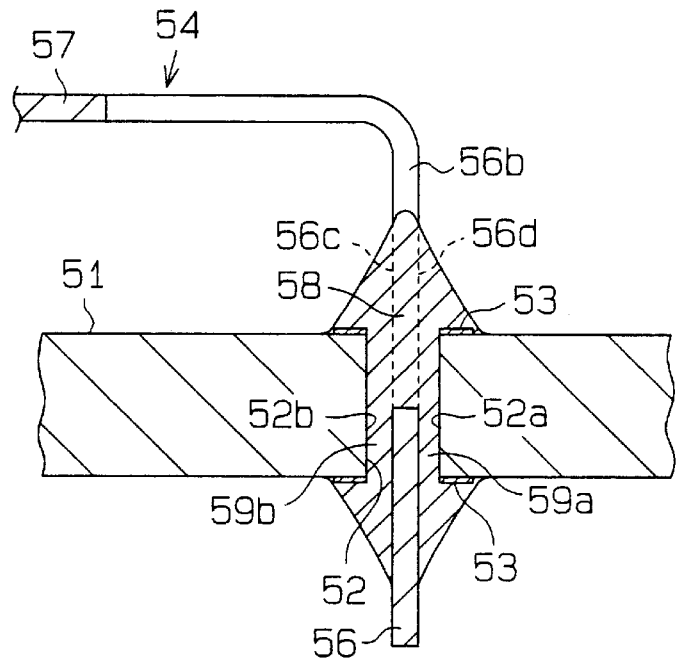
FIG. 18 is a schematic cross-sectional view showing a bonding portion of the previously proposed connector terminal of FIGS. 17A and 17B solder-bonded to conductors of the previously proposed circuit board.
Figure 19:
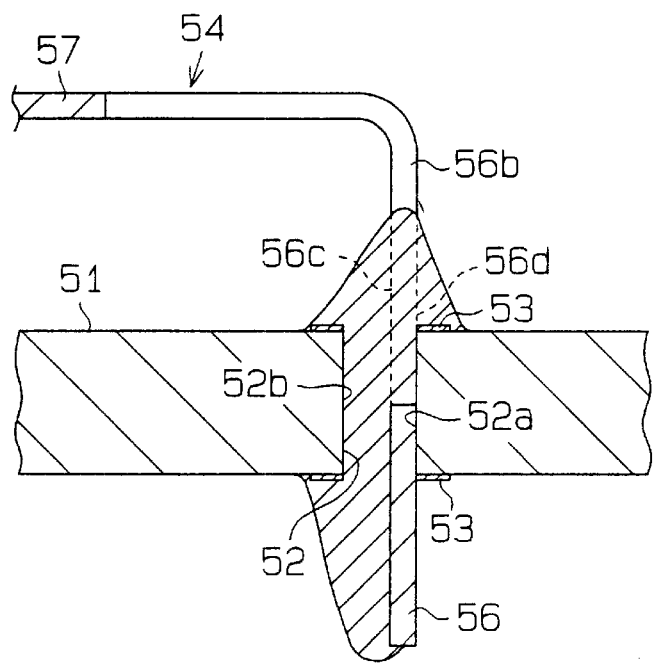
FIG. 19 is another schematic cross-sectional view showing the bonding portion of the previously proposed connector terminal of FIGS. 17A and 17B solder-bonded to the conductors of the previously proposed circuit board.

The bonding portion 25 of the above embodiment can be replaced with a bonding portion 31 including slits 32, as shown in FIGS. 12A and 12B. Each slit 32 extends outwardly beyond each one of the opposed sides of the circuit board 14 in the third direction when the bonding portion 31 is inserted to the predetermined position in the elongated hole 21. With this arrangement, each slit 32 provides a seventh flow passage P7 that allows the flow of the melted solder material toward the opposite side of the bonding portion 31 in the second direction with respect to the bonding portion 31, toward the opposite side of the circuit board 14 in the third direction and toward the opposite side of the circuit board 14 in the third direction on the opposite side of the bonding portion 31, respectively, when the side of the bonding portion 31 engages the wall surface 21a, as shown in FIG. 13. Thus, the effective flow of the melted solder material is achieved, so that the bonding portion 31 of a connector terminal 33 can be properly solder-bonded to both the conductors 22a, 22b of the circuit board 14.

Also, the bonding portion 25 of the above embodiment can be replaced with a bonding portion 41 shown in FIGS. 14A and 14B. The bonding portion 41 does not have any of the embossed portions 29 described in the above embodiment. Furthermore, in place of the slit 28, there is provided a slit 42 that extends from the bridge 26 to the distal end portion of the bonding portion 41 beyond the elongated hole 21 when the bonding portion 41 is inserted to the predetermined position in the elongated hole 21. With this arrangement, the slit 42 provides an eighth flow passage P8 that allows the flow of the melted solder material toward the opposite side of the bonding portion 41 in the second direction with respect to the bonding portion 41, toward the opposite side of the circuit board 14 in the third direction and also toward the opposite side of the circuit board 14 in the third direction on the opposite side of the bonding portion 41, respectively, when the side of the bonding portion 41 the wall surface 21a, as shown in FIG. 15. Thus, the effective flow of the melted solder material is achieved, so that the bonding portion 41 of a connector terminal 43 can be properly solder-bonded to both the conductors 22a, 22b of the circuit board 14.

In place of the two embossed portions 29 of the bonding portion 25, only one embossed portion 29 can be provided. Even with this arrangement, the effective flow of the melted solder material is achieved, so that the bonding portion 25 of the connector terminal 23 can be properly solder-bonded to both the conductors 22a, 22b of the circuit board 14.

Furthermore, in place of the two embossed portions 29 of the bonding portion 25, three or more embossed portions 29 can be provided. Also, in place of the one slit 28, two or more slits 28 can be provided. Even with this arrangement, the effective flow of the melted solder material is achieved, so that the bonding portion 25 of the connector terminal 23 can be properly solder-bonded to both the conductors 22a, 22b of the circuit board 14.

The positioning projections 27 can be modified in any manner as long as the positioning projections 27 abut against the circuit board 14 in the insertion direction when the bonding portion 25 is inserted to the predetermined position in the elongated hole 21. For example, the positioning projections 27 can be in any parts of the bonding portion 25 other than the ends of the bonding portion 25. Even with this arrangement, advantages similar to those of the above embodiment can be achieved.

Also, the bonding portion 25 can be modified to have no positioning projection 27. In such a case, other means should be provided to position the bonding portion 25 in the insertion direction in the elongated hole 21. Even with this arrangement, advantages similar to those described in the above sections (1)–(3) and (5) can be achieved.

In the above embodiment, the bridge 26 includes the vibration attenuating section 26a. However, the vibration attenuating section 26a can be modified to any other form as long as it can attenuate the vibrations of the stator 2. Even with this modification, advantages similar to those of the above embodiment can be achieved. Furthermore, the connector terminal 23 can be modified to have no vibration attenuating section 26a. Even with this arrangement, advantages similar to those described in the above sections (1)–(4) can be achieved.

In the above embodiment, the solder material (not shown) is applied to the flat surface 25a of the base end side region of the bonding portion 25 located on the embossed recess 29a side. Then, the soldering iron is applied against the top surface of the embossed protrusion 29b of each embossed portion 29 located on the base end side region of the bonding portion 25 to melt the solder material. The position of the solder material and the position of the soldering iron can be changed to any other positions. For example, both the solder material and the soldering iron can be applied to the flat surface 25a of the bonding portion 25.

In the above embodiment, the invention is embodied as the soldering structure of the connector terminal 23 used in the brushless motor. However, the above-described soldering structure of the terminal can be embodied in any other devices. In such a case, the bridge 26 and the fitting portion 24 of the connector terminal 23 can be changed to any form depending on the device to be used.

Additional advantages and modifications will readily occur to those skilled in the art. The invention in its broader terms is therefore, not limited to the specific details, representative apparatus, and illustrative examples shown and described.

What is claimed is:

1. A solder-bonding structure comprising:
a terminal having a generally planar section; and
a generally planar circuit board having an elongated hole for receiving said generally planar section of said terminal, said elongated hole penetrating through said circuit board and having a longitudinal axis that extends in a first direction that is generally parallel to said generally planar circuit board and said elongated hole comprises two conductors arranged around opposed open ends of said elongated hole, respectively; wherein:
said generally planar section of said terminal is arranged to be inserted through said elongated hole of said circuit board and to be solder-bonded to said two conductors, wherein said generally planar section of said terminal includes at least one flow-passage defining portion that defines at least one flow passage for permitting flow of melted solder material therethrough in a second direction perpendicular to a plane of said generally planar section of said terminal and also in a third direction generally perpendicular to the plane of said generally planar circuit board;
said flow-passage defining portion of said terminal includes:
at least one embossed portion that is formed by embossing said generally planar section of said terminal in said second direction to provide at least one embossed recess on one of opposed sides of said generally planar section of said terminal, wherein said at least one embossed recess provides communication between said opposed open ends of said elongated hole when said generally planar section of said terminal is inserted to a predetermined position in said elongated hole; and
a through hole penetrating through said generally planar section of said terminal, wherein said through hole extends over at least one of said opposed open ends of said elongated hole in said third direction when said generally planar section of said terminal is inserted to said predetermined position in said elongated hole; and
said at least one embossed portion includes a plurality of embossed portions, wherein said plurality of embossed portions are spaced from each other in said first direction and are embossed in a common direction.

2. A solder-bonding structure according to claim 1, wherein:
said plurality of embossed portions includes two embossed portions; and
said at least one through hole is formed between said two embossed portions.

3. A solder-bonding structure according to claim 1, wherein said terminal includes at least one vibration attenuating section.

4. A solder-bonding structure according to claim 1, wherein said terminal includes at least one projection that abuts against said circuit board when said generally planar section of said terminal is inserted to said predetermined position in said elongated hole.

5. A solder-bonding structure according to claim 4, wherein said at least one positioning projection includes to positioning projections, wherein said positioning projections project outwardly from opposed edges of said generally planar section of said terminal in said first direction.

6. A solder-bonding structure comprising:
- a generally planar circuit board having an elongated hole that penetrates through said circuit board, wherein said elongated hole has a longitudinal axis that extends in a first direction parallel to said generally planar circuit board, and said elongated hole is defined by at least one flat surface, and said elongated hole is provided with two conductors arranged around opposed open ends of said elongated hole respectively; and
- a terminal having a generally planar section that is arranged to be received through said elongated hole of said circuit board and to be solder-bonded to said two conductors, wherein said generally planar section of said terminal includes at least one flow-passage defining portion that defines at least one flow passage and said at least one flow passage allows flow of melted solder material therethrough in a second direction perpendicular to a plane of said generally planar section of said terminal and also in a third direction perpendicular to a plane of said circuit board, wherein said at least one allow-passage defining portion of said terminal includes:
  - at least one through hole penetrating through said generally planar section of said terminal, wherein said at least one through hole extends over at least one of said opposed open ends of said elongated hole in said third direction when said generally planar section of said terminal is inserted to a predetermined position in said elongated hole; and
  - at least one embossed portion that is formed by embossing said generally planar section of said terminal in said second direction to provide at least one embossed recess on one of opposed sides of said generally planar section of said terminal, wherein:
    each of said at least one embossed portion includes a flat wall that is engaged with one of said at least one flat surface when said generally planar section of said terminal is inserted to said predetermined position in said elongated hole; and
    said at least one embossed recess provides communication between said opposed open ends of said elongated hole when said generally planar section of said terminal is inserted to said predetermined position in said elongated hole.

7. A solder-bonding structure according to claim wherein:
said at least one embossed portion and said at least one through hole are arranged in said first direction; and
said at least one portion at least partially overlaps said at least one through hole in said third direction.

8. A solder-bonding structure according to claim 6, wherein:
said flat wall of said a least one embossed portion is a protruding portion of said embossed portion, said protruding portion allowing flow of melted solder material in the third direction.

9. A solder-bonding structure comprising:
- a generally planar circuit board having an elongated hole that penetrates through said circuit board, wherein said elongated hole has a longitudinal axis that extends in a first direction parallel to said generally planar circuit board, said elongated hole is defined by at least one flat surface and said elongated hole is provided with conductors arranged around opposed open ends of said elongated hole, respectively; and
- a terminal having a generally planar section, the generally planar section including insertion means for providing insertion of said terminal in said elongated hole of said circuit board to a predetermined position, the generally planar section further including flow-passage means for defining at least one flow passage of melted solder material therethrough in a second direction perpendicular to a plane of said generally planar section of said terminal and also in a third direction perpendicular to a plane of said circuit board, wherein said flow-passage means includes:
  - at least one through hole penetrating through said generally planar section of said terminal, wherein said at least one through hole extends over at least one of said opposed open ends of said elongated hole in said third direction when said generally planar section of said terminal is inserted to a predetermined position in said elongated hole; and
  - at least one embossed portion that is formed by embossing said generally planar section of said terminal in said second direction to provide at least one embossed recess on one of opposed sides of said generally planar section of said terminal, wherein:
    each of said at least one embossed portion includes a flat wall that is engaged with one of said at least one flat surface when said generally planar section of said terminal is inserted to said predetermined position in said elongated hole; and
    said at least one embossed recess provides communication between said opposed open ends of said elongated hole when said generally planar section of said terminal is inserted to said predetermined position in aid elongated hole.

* * * * *